(12) United States Patent
Kohno et al.

(10) Patent No.: US 6,823,181 B1
(45) Date of Patent: Nov. 23, 2004

(54) UNIVERSAL PLATFORM FOR SOFTWARE DEFINED RADIO

(75) Inventors: Ryuji Kohno, Tokyo (JP); Masayoshi Abe, Tokyo (JP); Noboru Sasho, Kanagawa (JP); Shinichiro Haruyama, Kanagawa (JP); Robert Henry Morelos-Zaragoza, Tokyo (JP); Francis Swarts, Tokyo (JP); Pieter Van Rooyen, Tokyo (JP); Yukitoshi Sanada, Tokyo (JP); Lachlan Bruce Michael, Saitama (JP); Hamid Amir-Alikhani, Leonberg (DE); Veselin Brankovic, Esslingen (DE)

(73) Assignees: Sony Corporation, Tokyo (JP); Sony International (Europe) GmbH, Berlin (DE)

( * ) Notice: Subject to any disclaimer, the term of this patent is extended or adjusted under 35 U.S.C. 154(b) by 131 days.

(21) Appl. No.: 10/070,283
(22) PCT Filed: Jul. 7, 2000
(86) PCT No.: PCT/JP00/04550
§ 371 (c)(1),
(2), (4) Date: Jul. 23, 2002
(87) PCT Pub. No.: WO02/05444
PCT Pub. Date: Jan. 17, 2002

(51) Int. Cl.[7] .................................................. H04B 1/26
(52) U.S. Cl. .................... 455/324; 455/333; 455/323
(58) Field of Search ................................ 455/149, 313, 455/318, 323, 324, 333, 334; 327/65, 76.11, 600, 647

(56) References Cited

U.S. PATENT DOCUMENTS 5,079,454 A    1/1992   Benton et al.

FOREIGN PATENT DOCUMENTS

EP    0 884 836 A1  * 12/1998  ............ H03D/3/00
EP    1 014 562       6/2000

* cited by examiner

Primary Examiner—Lester G. Kincaid
(74) Attorney, Agent, or Firm—Frommer Lawrence & Haug LLP; William S. Frommer; Sam S. Lee

(57) ABSTRACT

The universal platform for the SDR of the present invention employs the direct conversion approach with the n-port MMIC followed by reconfigurable reprogrammable devices such as DSP's or FPGA's. The universal platform is based on the linear operation of the devices. Thus, the DC offset problem may be solved. It is also possible to support very wide bandwidths compared with conventional I/Q receivers. Therefore, the present universal platform is suitable for multimode and multiband communications.

27 Claims, 15 Drawing Sheets

(PRIOR ART)

200C

UNIVERSAL PLATFORM FOR SOFTWARE DEFINED RADIO

TECHNICAL FIELD

The present invention relates to a universal platform suitable for software defined radio and capable of handling multiple radio standards.

BACKGROUND INVENTION

After the first technical paper was presented in 1992, software defined radio (SDR) has been receiving much attention among researchers working on wireless communications (refer to J. Mitola III, D. Chester, S. Haruyama, T. Turletti, and W. Tuttlebee, "Globaliazation of Software Radio," IEEE Communications Magazine, vol.37, no.2, pp.82–83, February 1999, and R. Kohno, "Prespective of Software Radio: Spatial and Temporal Communication Theory Using Adaptive Array Antenna for Mobile Radio Communications", Proceeings on Microwave Workshops and Exhibition (MWE '97), December 1997). There is a conceptual reason and a technical reason behind this popularity (refer to J. Mitola III, "Technical Challenges in the Globalization of Software Radio," IEEE Communications Magazine, vol.37, no.2, pp.84–89, February 1999).

The conceptual reason is that various wireless standards have been established through generations of wireless communication systems. Even in the same generation, several standards have been created in different regions.

As an example, the standardization efforts surrounding IMT2000/UMTS have tried to resolve the dispute over what the third generation standard should entail. Despite all of this, it still seems as if three slightly varying code division multiple access (CDMA) standards will be introduced in the near future.

For wireless local area networks (LAN), not only IEEE standards, but also de facto standards such as Bluetooth have gained wide acceptance among companies all over the world. Thus, a multiband multimode radio system is required to create a comfortable mobile computing environment. The reconfigurability of SDR is the answer to this problem.

The technical reason behind the popularity of the SDR concept is the development of reconfigurable devices for signal processing such as digital signal processors (DSP) and field programmable gate arrays (FPGA). The latest DSP's operate at speeds up to 1.1 GHz and offer performance of nearly 9 billion instructions per second. FPGA's can now provide densities of up to 2 million gates with low power consumption. These numbers are ever improving (refer to M. Cummings and S. Haruyama, "FPGA in the Software Radio," IEEE Communications Magazine, vol.37, no.2, pp.108–112, February 1999, and F. J. Harris, "Configurable Logic for Digital Communications: Some Signal Processing Perspective", IEEE Communications Magazine, vol.37, no.8, pp.107–111, August 1999).

Therefore, the real challenges facing SDR are the RF front-end, which is able to use the reconfigurability of the signal processing devices mentioned above and providing multimode and multiband communications.

In order to realize a multimode multiband SDR, the RF front-end should be able to support a wide range of frequencies and bandwidths. This task may be difficult with conventional RF front-end architectures (H. Tsurumi and Y. Suzuki, "Broadband RF Stage Architecture for Software-Defined Radio in Handheld Terminal Applications," IEEE Communications Magazine, vol.37, no.2, pp.90–95, February 1999).

FIG. 1 is a block diagram of a conventional heterodyne receiver.

The heterodyne receiver 10 of FIG. 1 comprises a receiving antenna 11, a low noise amplifier (LNA) 12, a radio-frequency (RF) filter 13, an RF mixer 14, an RP use local oscillator 15, a first intermediate-frequency (IF) filter 16, an IF mixer 17, an IF use local oscillator 18, a second IF filter, an automatic gain controlled (AGC) amplifier 20, and an analog-to-digital converter (ADC) 21.

This architecture requires frequency-dependent passive components such as a dielectric filter 13 in the RF stage and surface acoustic wave (SAW) filter 16 in the first IF stage. A ceramic or crystal filter 19 is also needed in the second IF stage. The center frequencies and bandwidth of these filters 13, 14, and 19 are not flexible and not wide enough to support a multiband radio receiver.

Though switched capacitor filter banks and precision direct synthesis may be a choice to achieve wider bandwidths and programmability, they are not applicable to mobile terminals due to their size and weight.

Thus, the candidate for the RF front-end for SDR is the direct conversion (DC) principle.

FIG. 2 is a block diagram of a conventional direct conversion receiver.

The direct conversion receiver 30 of FIG. 2 comprises a receiving antenna 31, an LNA 32, RF mixers 33 and 34, an RP use local oscillator 35, a n/2 phase shifter 36, low-pass filters (LPF's) 37 and 38, AGC amplifiers 39 and 40, and ADC's 41 and 42.

In the direct conversion receiver 30 of FIG. 2, the received signal is down-converted directly to baseband by the quadrature mixer. The down-converted in-phase and quadrature (IQ) signals are prefiltered by the anti-aliasing LPF's 37 and 38 with variable cutoff frequency. They are converted to digital signals by IQ ADC's 41 and 42 and fed to the digital stage. The desired signal is selected by the software defined filter with programmable cutoff frequency.

The DC technique inherently has no image response, and the fixed-frequency image rejection filters can be eliminated. Furthermore, the anti-alias LPF can be designed with active, variable-bandwidth filters such as a switched capacitor embedded in an LSI chip.

In the conventional DC technique, the mixer has been used, however, in general it is difficult to design the mixer for a wide bandwidth. Therefore, if the conventional DC technique is applied to the software wireless system, improvement is necessary in point of widening the bandwidth.

Further, in the conventional direct conversion receiver, a sufficiently high local power is necessary in order to make the mixer operate with satisfactory characteristics. This invites an increases of power consumption of the receiver. Especially, when the carrier frequency is high, it is difficult to obtain a lower power consumption and a high local output power.

DISCLOSURE OF INVENTION

An object of the present invention is to provide a universal platform for software defined radio capable of solving the DC offset problem and supporting very wide bandwidths.

According to the first aspect of the present invention, there is provided a universal platform for software defined radio, comprising an n (n being an integer of 3 or more)-port receiver including: a first input terminal receiving as input a received signal, a second input terminal receiving as input a local signal, a generating means for generating two signals having a phase difference based on at least one signal between the received signal input from the first input terminal or the local signal input from the second input terminal and including at least one output terminal for outputting the generated signal, and at least one power detector for receiving as input the output signal from the output terminal and detecting the signal level of the input signal; and a converter for converting the output signal of the power detector to a plurality of signal components included in the received signal or the local signal.

According to a second aspect of the present invention, there is provided a universal platform for software defined radio, comprising an n (n being an integer of 3 or more)-port receiver including a first input terminal receiving as input a received signal, a second input terminal receiving as input a local signal, a generating means for generating two signals having a phase difference based on at least one signal between the received signal input from the first input terminal or the local signal input from the second input terminal and including at least one output terminal for outputting the generated signal, and at least one power detector for receiving as input the output signal from the output terminal and detecting the signal level of the input signal; at least one analog-to-digital (A/D) converter for converting the output analog signal from the corresponding power detector to a digital signal, and a digital signal processing part for converting the output signal of the power detector through the A/D converter to a plurality of signal components included in the received signal or the local signal.

In the present invention, the digital signal processing part compensates for the non-linearity of the power detector.

Further, in the present invention, the power detector preferably comprises a first field effect transistor receiving the input signal at its gate, a second field effect transistor with a source connected to a source of the first field effect transistor, a first gate bias supplying circuit for supplying a gate bias voltage to the gate of the first field effect transistor, a second gate bias supplying circuit for supplying a gate bias voltage to a gate of the second field effect transistor, a current source connected to the connecting point of the sources of the first field effect transistor and the second field effect transistor, a drain bias supplying circuit for supplying a drain bias voltage to the drains of the first field effect transistor and the second field effect transistor, a first capacitor connected between the drain of the first field effect transistor and a reference potential, and a second capacitor connected between the drain of the second field effect transistor and the reference potential, and wherein the voltage difference between the drain voltage of the first field effect transistor and the drain voltage of the second field effect transistor is processed as a detection output.

Further, in the present invention, preferably, the first field effect transistor and the second field effect transistor have substantially the same characteristics, the drain bias supplying circuit includes a first drain bias use resistance element connected between the drain of the first field effect transistor and a voltage source and includes a second drain bias use resistance element connected between the drain of the second field effect transistor and a voltage source, a resistance of the first drain bias use resistance element and a resistance of the second drain bias use resistance element are set to substantially equivalent values, and a capacitance of the first capacitor and a capacitance of the second capacitor are set to substantially equivalent values.

Further, in the present invention, preferably, when a gate width of the first field effect transistor is $W_{ga}$ and a gate width of the second field effect transistor is $W_{gb}$, the ratio $W_{ga}/W_{gb}$ is set to N, the drain bias supplying circuit includes a first drain bias use resistance element connected between the drain of the first field effect transistor and a voltage source and includes a second drain bias use resistance element connected between the drain of the second field effect transistor and a voltage source, a resistance Ra of the first drain bias use resistance element and a resistance of the second drain bias use resistance Rb element are set so as to satisfy the condition Ra/Rb=1/N, and a capacitance of the first capacitor and a capacitance of the second capacitor are set to substantially equivalent values.

Further, in the present invention, the power detector preferably alternatively comprises a first field effect transistor receiving the input signal at its gate and with a source connected to a reference potential, a second field effect transistor with a source connected to the reference potential, a first gate bias supplying circuit for supplying a gate bias voltage to the gate of the first field effect transistor, a second gate bias supplying circuit for supplying a gate bias voltage to a gate of the second field effect transistor, a drain bias supplying circuit for supplying a drain bias voltage to the drains of the first field effect transistor and the second field effect transistor, a first capacitor connected between the drain of the first field effect transistor and a reference potential, and a second capacitor connected between the drain of the second field effect transistor and the reference potential, and wherein the voltage difference between the drain voltage of the first field effect transistor and the drain voltage of the second field effect transistor is processed as a detection output.

According to the present invention, for example, an RF signal is received and input to the generating means of the n-port receiver through the first input terminal, while the local signal generated, for example, by a local oscillator is input to the generating means of the n-port receiver through the second input terminal.

In the generating means, two signals having a phase difference based on the received signal or the local signal are generated. The generated signal is output to the power detector from the output terminal (port).

In the power detector, the input signal level is detected. The detected signal is, for example, converted from an analog to digital format and fed to the digital signal processing part.

In the digital signal processing part, the converted digital signal of the power detector is converted to a plurality of signal components included in the received signal or the local signal.

BRIEF DESCRIPTION OF DRAWINGS

These and other objects and features of the present invention will become clearer from the following description of the preferred embodiments given with reference to the accompanying figures, in which.

BEST MODE FOR CARRYING OUT THE INVENTION

Below, the best modes of the universal platform for SDR (Software Defined Radio) will be described in detail with reference to the accompanying drawings.

Figure 1:
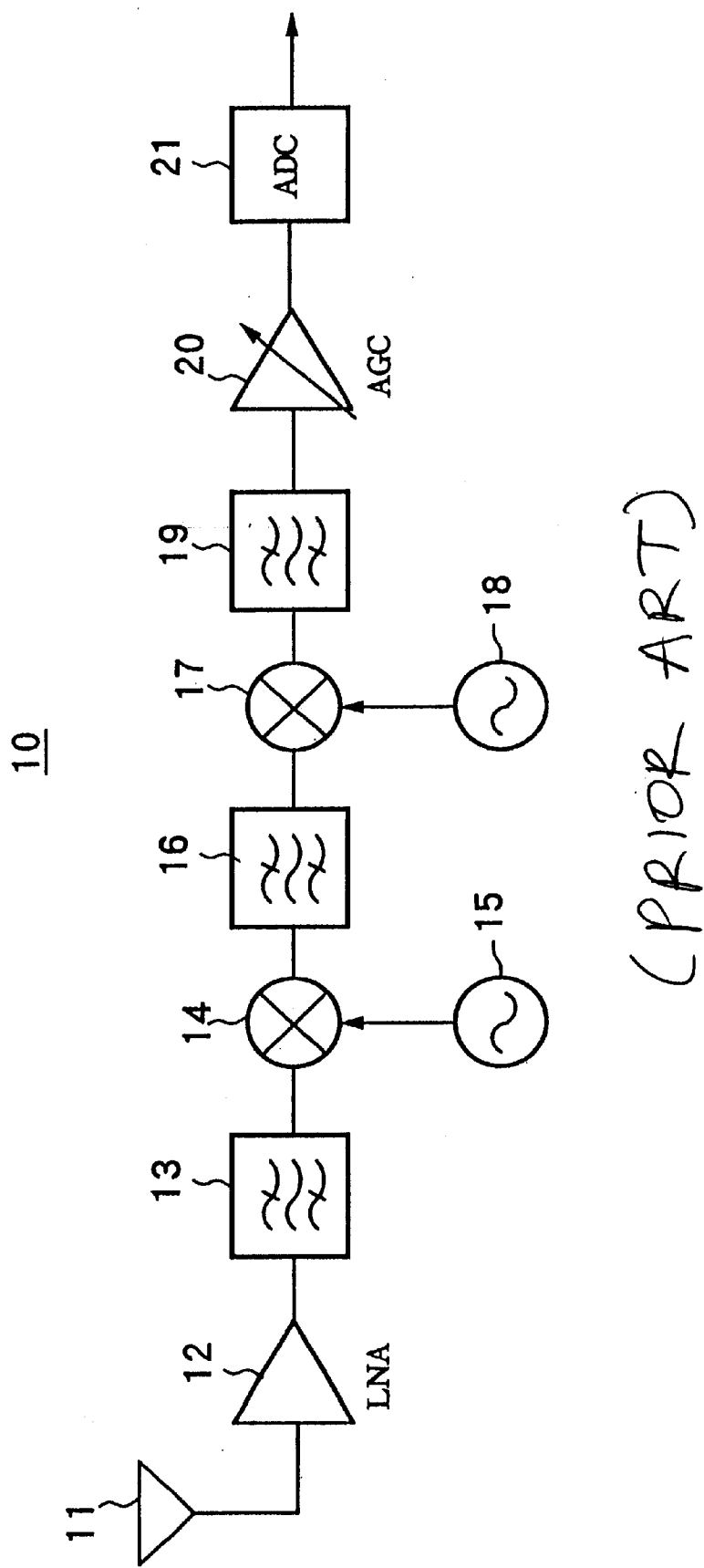
FIG. 1 is a block diagram of a conventional heterodyne receiver.
Figure 2:
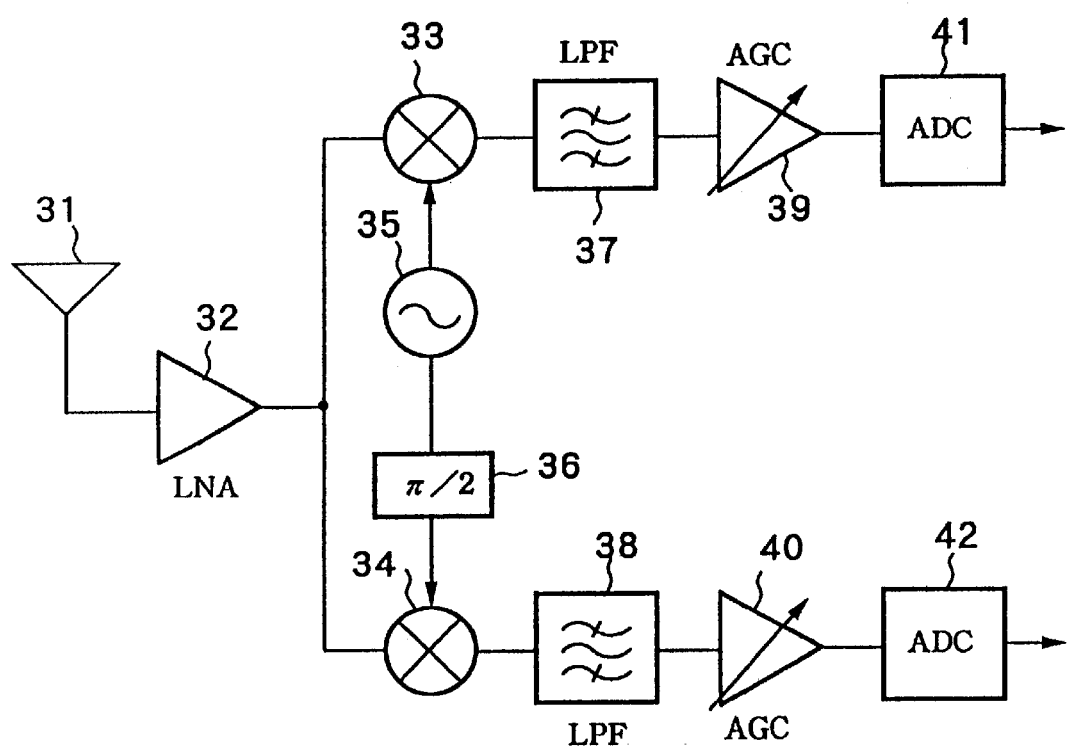
FIG. 2 is a block diagram of a conventional direct conversion receiver.
Figure 3:
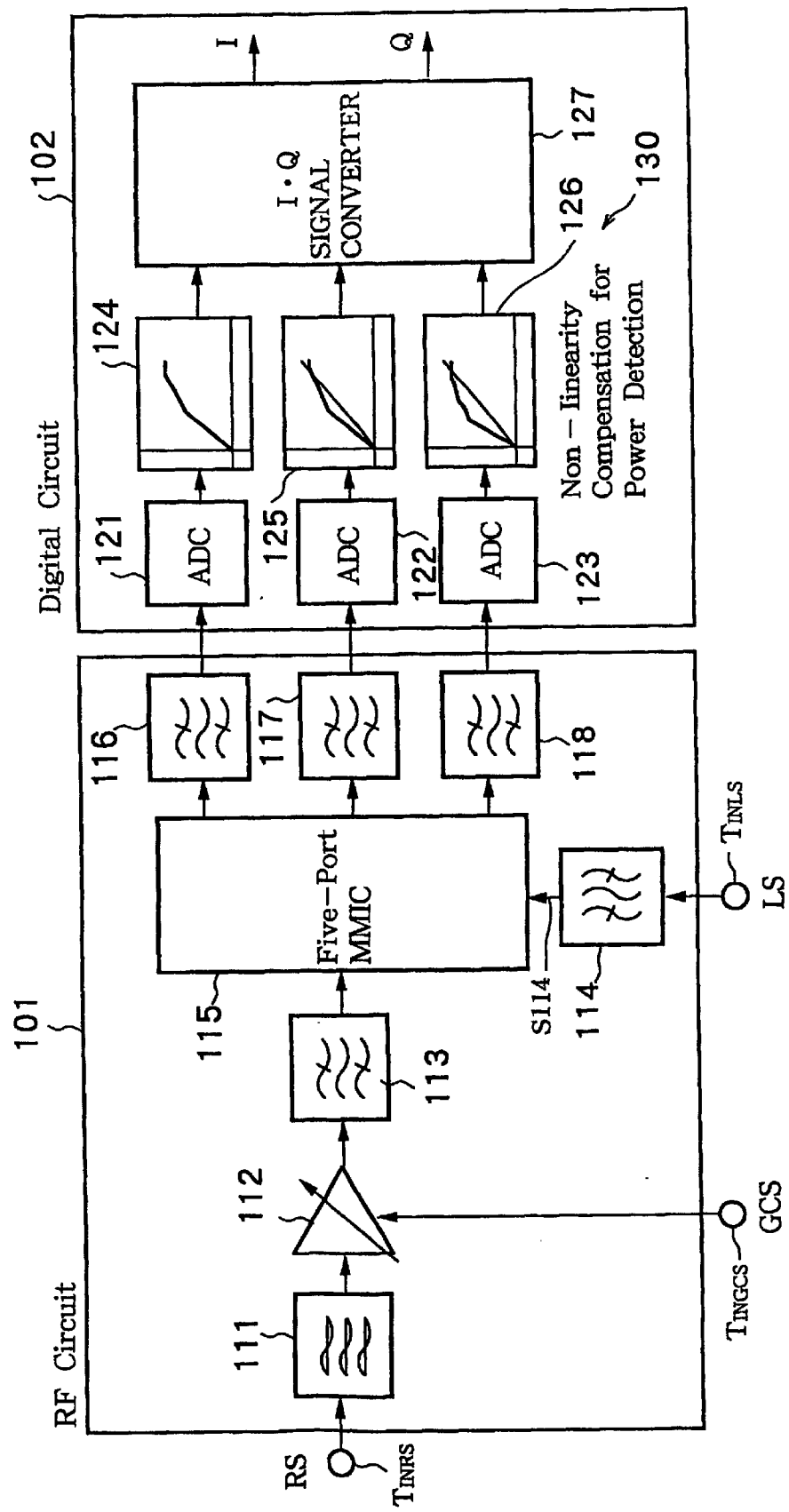
FIG. 3 is a block diagram of an embodiment of a universal platform for SDR according to the present invention.

FIG. 3 is a block diagram of an embodiment of a universal platform for SDR according to the present invention.

The universal platform 100 comprises, as shown in FIG. 3, an RF circuit 101 and a digital circuit 102.

The RF circuit 101 is configured by a first pre-select filter 111 constituted by, for example, a band pass filter (BPF), a gain controlled LNA (low noise amplifier) 112, a second pre-select filter 113 constituted by, for example, an BPF (band-pass filter), a local filter 114 constituted by, for example, the LPP, an n (in this embodiment, n=5)-port direct conversion receiver MMIC (Monolithic Microware Integrated Circuit) 115, and LPF's 116, 117, and 118.

Further, the digital circuit 102 is configured by ADC's (Analog-to-Digital Converters) 121, 122, and 123, non-linearity compensation circuits 124, 125, and 126, and an n-port IQ signal converter 127.

The five-port MMIC 115 combines two input signals, which are a received software defined radio (SDR) signal RS and a local signal LS, in linear combinations and outputs three signals, wherein the analog power values of the output signals are detected by power detectors PD1, PD2, and PD3.

Next, the internal configuration of the five-port MMIC 115 will be explained with reference to FIGS. 4 and 5.

Figure 4:
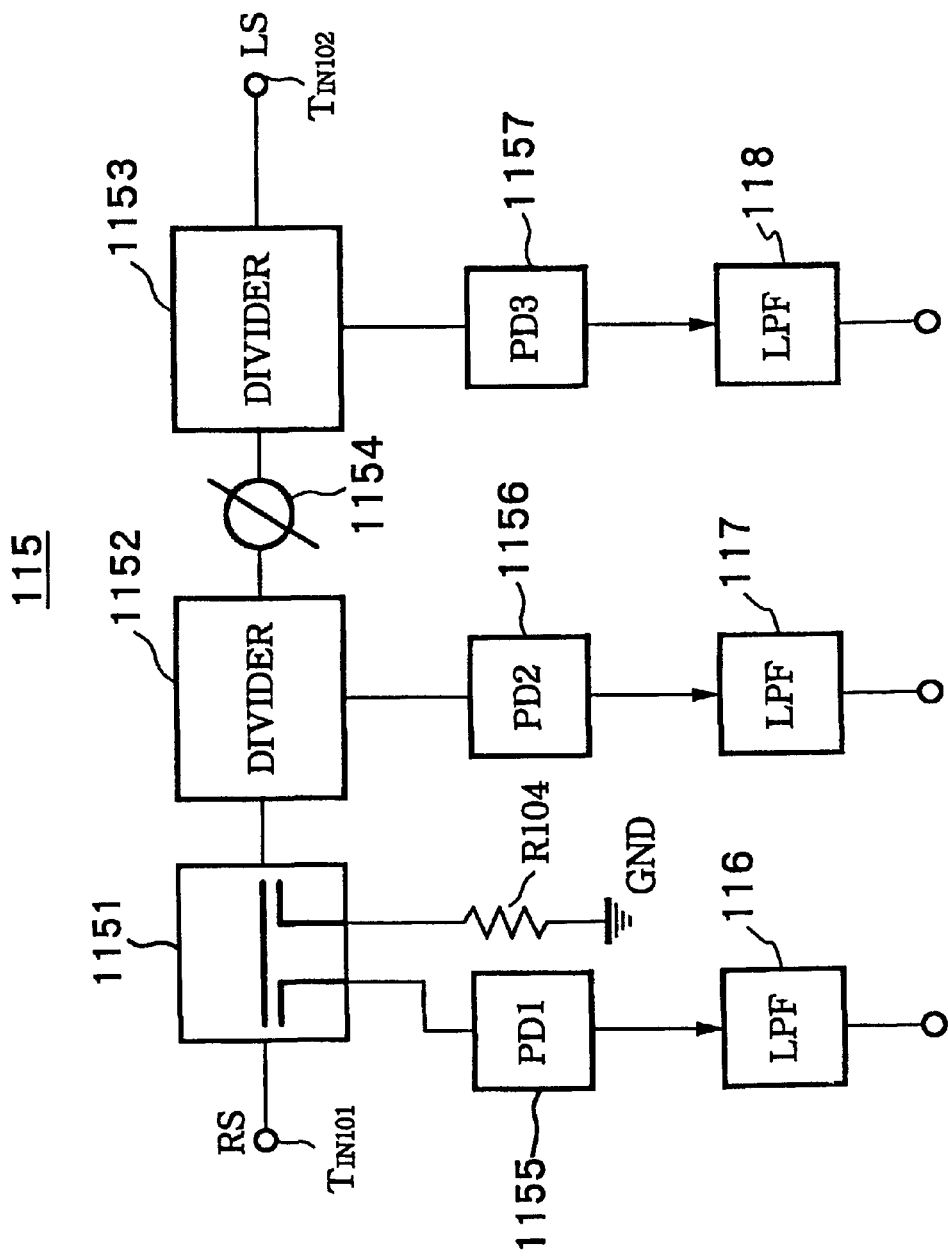
FIG. 4 is a block diagram of a five-port MMIC according to the present invention.
Figure 5:
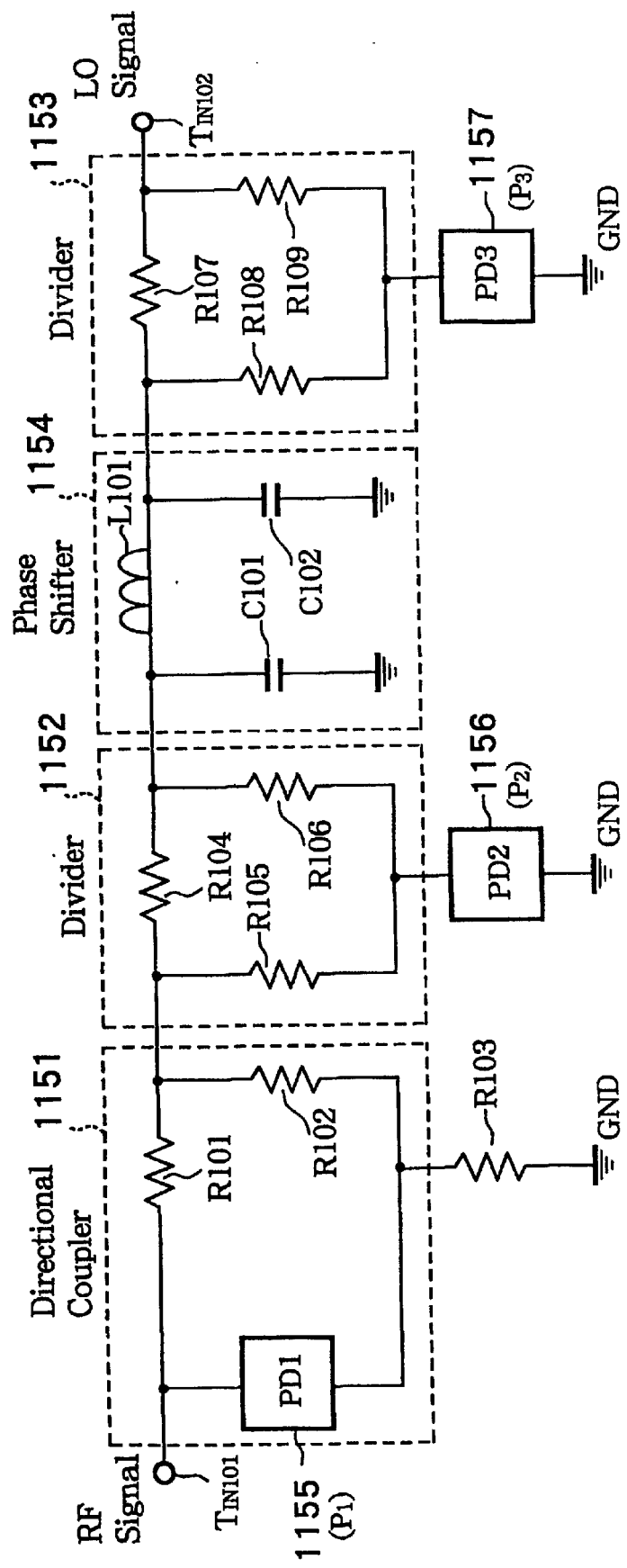
FIG. 5 is a view of a concrete structure except the power detectors of the five-port MMIC of FIG. 4.

FIG. 4 is a block diagram of the five-port MMIC according to the present invention, while FIG. 5 is a view of a concrete structure except the power detectors of the five-port MMIC of FIG. 4.

The five-port MMIC 115 comprises, as shown in FIGS. 4 and 5, a directional coupler 1151 constituted by resistors R101 to R103, a divider 1152 constituted by resistors R104 to R106, a divider 1153 constituted by resistors R107 to R109, a phase shifter 1154 constituted by capacitors C101 and C102 and an inductor L101, and power detectors 1155 (PD1), 1156 (PD2), and 1157 (PD2).

Here, the five ports are comprised of a received signal RS use input terminal (first input terminal) $T_{IN101}$, a local signal LS use input terminal (second input terminal) $T_{IN102}$, an output terminal (port) of the directional coupler 1151 to the power detector 1155, an output port of the divider 1152 to the power detector 1156, and an output port of the divider 1153 to the power detector 1157.

In the five-port MMIC 115, the received signal RS input to the input terminal $T_{I101}$ is input to the divider 1152 and a part of the same is input to the power detector 1155 by the directional coupler 1151.

The received signal input to the divider 1152 is divided to two signals. One divided signal is input to the power detector 1156, while the other divided signal is input to the phase shifter 1154.

In the phase shifter 1154, the received signal from the divider 1152 is shifted in phase by θ. The signal shifted in phase is input to the divider 1153, and the input signal is divided to two signals. One divided signal is input to the power detector 1157, while the other divided signal is supplied to the input terminal $T_{IN102}$.

Alternatively, the local signal input to the input terminal $T_{IN102}$ is input to the divider 1153 and then the local signal is divided to two signals by the divider 1153. One divided signal is input to the power detector 1157, while the other divided signal is input to the phase shifter 1154.

In the phase shifter 1154, the local signal from the divider 1153 is shifted in phase by θ. The signal shifted in phase is input to the divider 1152, and the input signal is divided to two signals. One divided signal is input to the power detector 1156, while the other divided signal is input to the directional coupler 1151.

As explained above, the power detector 1155 receives the received signal RS. In the power detector 1155, the amplitude component of the supplied signal is detected, and the detected amplitude component is supplied to the LPF 116.

The power detector 1156 receives the received signal and the local signal shifted in phase by θ. In the power detector 1156, the amplitude components of the supplied signals are detected, and the detected amplitude components are supplied to the LPF 117.

The power detector 1157 receives the local signal and the received signal shifted in phase by θ. In the power detector 1157, amplitude components of the supplied signals are detected and the detected amplitude components are supplied to the LPF 118.

Next, the concrete configuration of the power detector capable of being applied to the five-port MMIC of FIGS. 4 and 5 will be explained.

Figure 6:
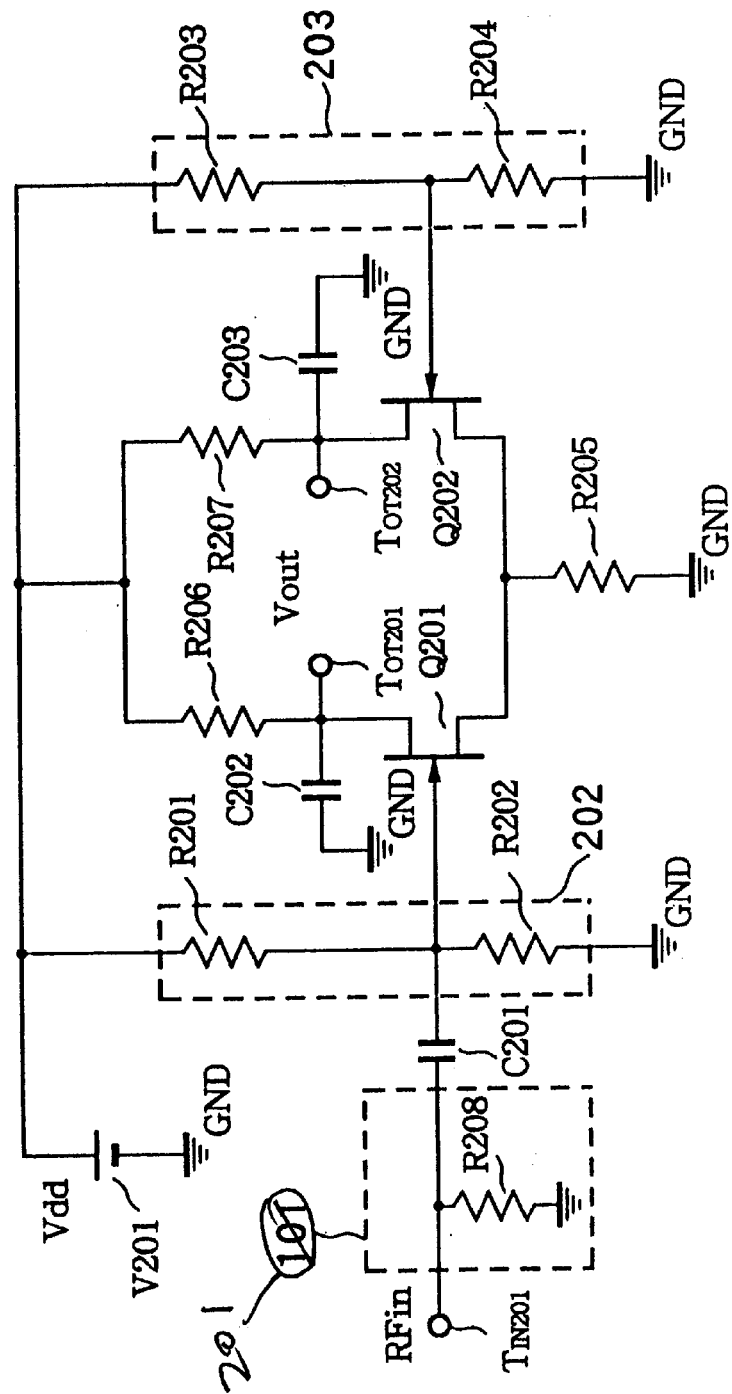
FIG. 6 is a circuit diagram of an example of the power detector according to the present invention.

FIG. 6 is a circuit diagram of an example of the power detector according to the present invention.

The power detector 200 ($PD_1$, $PD_2$, $PD_3$) comprises, as shown in FIG. 6, field effect transistors (hereinafter, referred to as "transistors") Q201 and Q202 as active elements, resistors R201, R202, R203, R204, R205, R206, and R207, a power source V201, a matching circuit (MTR) 201, and gate bias supplying circuits 202 and 203.

The matching circuit 201 is constituted by a resistor R208. The resistor R208 is connected between the connection point of an input terminal $T_{IN201}$ and one electrode of the DC cutoff use capacitor C201 and the ground potential GND.

The gate bias supplying circuit 202 is constituted by resistors R201 and R202 connected in series between the power source V201 and the ground potential GND. The connection point of the resistors R201 and R202 is connected to another electrode of the capacitor C201 and a gate of the transistor Q201.

The gate bias supplying circuit 202 having the configuration described above generates a bias voltage of the transistor Q201 by dividing the voltage Vdd of the power source V201 by the resistors R201 and R202.

The gate bias supplying circuit 203 is constituted by resistors R203 and R204 connected in series between the power source V201 and the ground potential GND. The connection point of the resistors R203 and R204 is connected to a gate of the transistor Q202.

The gate bias supply circuit 203 having the configuration described above generates a bias voltage of the transistor Q202 by dividing the voltage Vdd of the power source V201 by resistors R203 and R204.

A source of the transistor Q201 and a source of the transistor Q202 are connected, and the connection point of the source is connected to the ground potential GND through the resistor R205 (as a current source).

A drain of the transistor Q201 is connected to one terminal of the resistor R206, one electrode of the capacitor C202, and a first output terminal $T_{OT201}$. Another terminal of the resistor R206 is connected to the power source V201 of the voltage Vdd. Another electrode of the capacitor C202 is connected to the ground potential GND.

A drain of the transistor Q202 is connected to one terminal of the resistor R207, one electrode of the capacitor C203, and a second output terminal $T_{OT202}$. Another terminal of the resistor R207 is connected to the power source V201. Another electrode of the capacitor C203 is connected to the ground potential GND.

A drain vias voltage Vdd is supplied to the drain of the transistor Q201 through the resistor R206 and to the drain of the transistor Q202 through the resistor R207.

In the power detector 200 constituted by the above relationship of connection, the transistors Q201 and Q202 serving as active elements, have, for example, substantially equivalent structures so as to have substantially equivalent characteristics.

Accordingly, in the power detector 200, a resistance Rga1 of the resistor R201 and a resistance Rgb1 of the resistor R202 of the gate bias supplying circuit 202 and a resistance Rga2 of the resistor R203 and a resistance Rgb2 of the resistor R204 of the gate bias supplying circuit 203 satisfy the conditions Rga1=Rga2 and Rgb1=Rgb2 so as to make the gate bias voltages of the transistors R201 and R202 as equal as possible.

Further, a resistance Ra of the resistor R206 connected to the drain of the transistor Q201 and a resistance Rb of the resistor R207 connected to the drain of the transistor Q202 satisfy the condition Ra=Rb.

Similarly, it is to be desired that a capacitance Couta of the capacitor C202 and a capacitance Coutb of the capacitor C203 satisfy the condition Couta=Coutb. The capacitances Couta and Coutb are set to values large enough so that the impedance becomes substantially zero ohm at the higher frequency including an input frequency fin of the input high-frequency signal.

Next, the operation of the power detector having the above configuration will be explained.

The high-frequency Rfin input to the input terminal $T_{IN201}$ is supplied to the gate of the transistor Q201 through the matching circuit 201 and the DC cutoff use capacitor C201.

At this time, the gate bias voltage generated by the gate bias supplying circuit 202 is supplied to the gate of the transistor Q201. Similarly, the gate bias voltage generated by the gate bias supply circuit 203 is supplied to the gate of the transistor Q202.

Further, the drain bias voltage is supplied to the drain of the transistor Q201 through the resistor R206, and supplied to the drain of the transistor Q202 through the resistor R207.

In this state, since the coupling capacitor C202 having the large enough value is connected between the drain of the transistor Q201 and the ground potential GND, and the coupling capacitor C203 having the large enough value is connected between the drain of the transistor Q202 and the ground potential GND, the drains of the transistors Q201 and Q202 become stable states in the high-frequency.

As the result, the difference of voltage between the drain voltage of the transistor Q201 at the first output terminal $T_{OT201}$, and the drain voltage of the transistor Q202 at the second output terminal $T_{OT202}$ is supplied as the detected signal Vout to the later processing circuit, for example, LPF.

Below, the detection characteristic of the power detector of FIG. 6 will be considered with reference to FIGS. 7 and 8.

Figure 7:
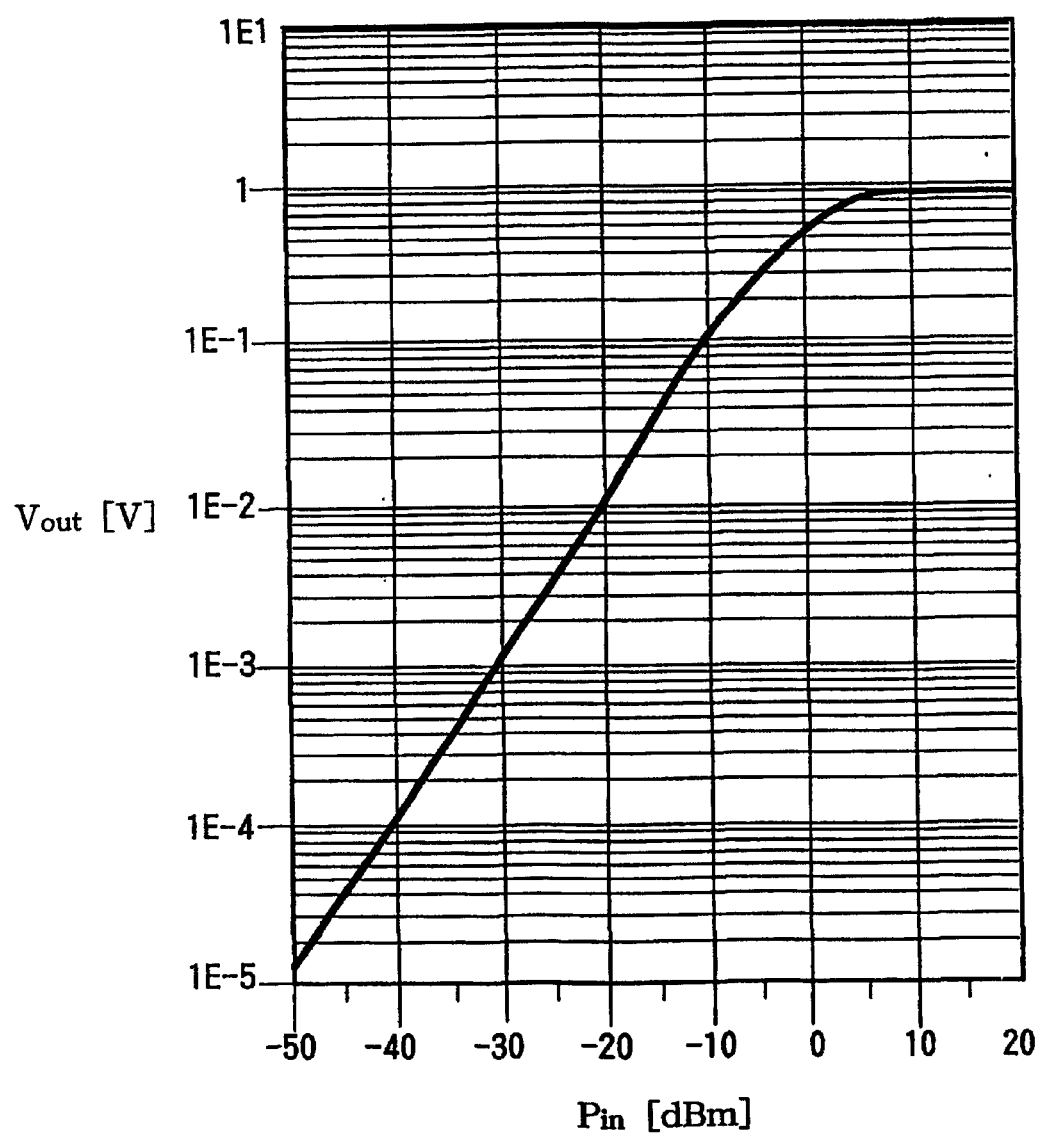
FIG. 7 is a view of an example of the detection characteristic of the power detector of FIG. 6.

FIG. 7 is a view of an example of the detection characteristic of the power detector of FIG. 6.

In FIG. 7, the abscissa indicates the input high-frequency power Pin, and the ordinate indicates the output detected voltage Vout. The frequency of the input high-frequency signal is 5.5 GHz.

As will be understood from FIG. 7, the power detector of FIG. 6 has a comparatively good linearity.

Figure 8:
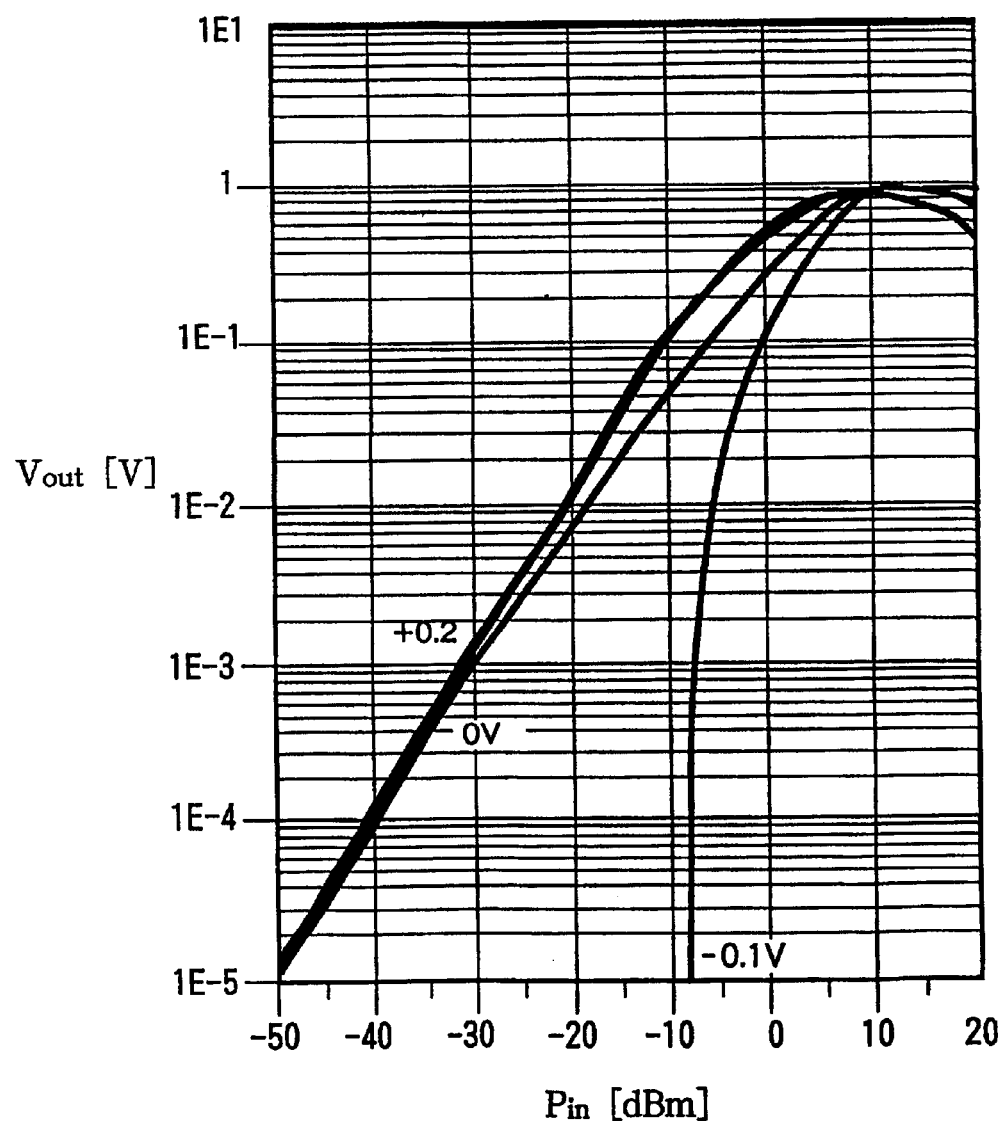
FIG. 8 is a view of the detection characteristic of the power detector of FIG. 6 when the gate bias voltages are adopted as parameters.

FIG. 8 is a view of the detection characteristic of the power detector of FIG. 6 when the gate bias voltages are adopted as parameters.

In FIG. 8, the abscissa indicates the input high-frequency power Pin, and the ordinate indicates the output detected voltage Vout.

As will be understood from FIG. 8, the change of the Pin versus Vout characteristic is very small with respect to the change of the gate bias.

Namely, almost no DC offset occurs in the power detector of FIG. 6.

Next, the operation of the universal platform of FIG. 3 will be explained.

A modulated RF signal is received by a not illustrated antenna and input to the RF circuit 101 via the input terminal $T_{INRS}$.

In the RF circuit, the received signal RS is passed through the first pre-select filter 111 and supplied to the gain controlled LNA 112. The gain of the LNA 112 is controlled by a gain control signal GCS supplied from a not illustrated control circuit through an input terminal $T_{INGCS}$. The output signal of the LNA 112 is passed through the second pre-select filter 113 and supplied to the first input terminal $T_{IN101}$ of the five-port MMIC 115. The local signal LS generated and controlled in gain by a not illustrated local oscillator (LO) is supplied through the input terminal $T_{INLS}$ and the local filter 114.

In the five-port MMIC 115, two input signals RS and LS are combined in linear combinations. As a result, three signals are output. The analog power values of the output three signals are detected by the power detectors 1155 ($PD_1$), 1156 ($PD_2$), and 1157 ($PD_3$).

The outputs of the power detectors 1155, 1156, and 1157, as shown in FIG. 3, are passed through the LPF's 116, 117, and 118 and supplied to the A/D converters 121, 122, and 123. In the A/D converters 121, 122, and 123, the supplied signals are converted from the analog to digital format and fed to the digital signal processing part 130 constituted by the non-linearity compensation circuits 124, 125, and 126 and the n-port IQ signal converter 127.

In the digital signal processing part 130, the non-linearities of the power detectors are compensated for by the non-linearity compensation circuit 124, 125, and 126, and the results supplied to the IQ signal converter 127.

In IQ signal converter 127, the in-phase (I) and the quadrature (Q) values of the signal are calculated from the three output voltages of the power detectors by means of the following equations:

$$I = -\frac{K_{21}K_{32} + K_{22}K_{31}}{4K_{21}K_{31}\cos\theta} - \frac{K_{21}K_{32} + K_{22}K_{31}}{4K_{11}^2 K_{22}K_{32}\cos\theta}\frac{P_1}{R_0 P_{10}} + \quad (1)$$

$$\frac{1}{4K_{21}K_{22}\cos\theta}\frac{P_2}{R_0 P_{10}} + \frac{1}{4K_{31}K_{32}\cos\theta}\frac{P_3}{R_0 P_{10}} =$$

$$h_{I0} + h_{I1}P_1 + h_{I2}P_2 + h_{I3}P_3$$

$$Q = -\frac{K_{21}K_{32} - K_{22}K_{31}}{4K_{21}K_{31}\sin\theta} + \frac{K_{21}K_{32} - K_{22}K_{31}}{4K_{11}^2 K_{22}K_{32}\sin\theta}\frac{P_1}{R_0 P_{10}} \quad (2)$$

$$-\frac{1}{4K_{21}K_{22}\sin\theta}\frac{P_2}{R_0 P_{10}} + \frac{1}{4K_{31}K_{32}\sin\theta}\frac{P_3}{R_0 P_{10}} \quad (3)$$

$$= h_{Q0} + h_{Q1}P_1 + h_{Q2}P_2 + h_{Q3}P_3 \quad (4)$$

where $K_{ij}$ is the voltage transfer coefficient of the five-port junction, i is the output port of each power detector 1155, 1156 and 1157, j=1 is the received signal port, j=2 is the local signal port, e is the phase shift value of the phase shifter 1154, $P_i$ is the output voltage of each power detector 1155, 1156, and 1157, $P_{lo}$ is the local oscillator (LO) signal power, and $R_o$ is a coefficient depending on the power detector load resistance of the LO.

The coefficients $h_{Ii}$ and $h_{Qi}$ can be calculated directly through a simple calibration procedure. Thus, influences like mismatch of the power detectors and isolation amplifier, gain and resistor tolerances, inaccurate assessment of phase shifts, and LO level fluctuations may be directly considered and calibrated. A single calibration procedure is sufficient if influences due to temperature drifts may be neglected. The remaining difficulty is to take into account the non-linear behavior of the power detectors. Here, the non-linearity is compensated for by means of the digital signal processing.

Figure 9:
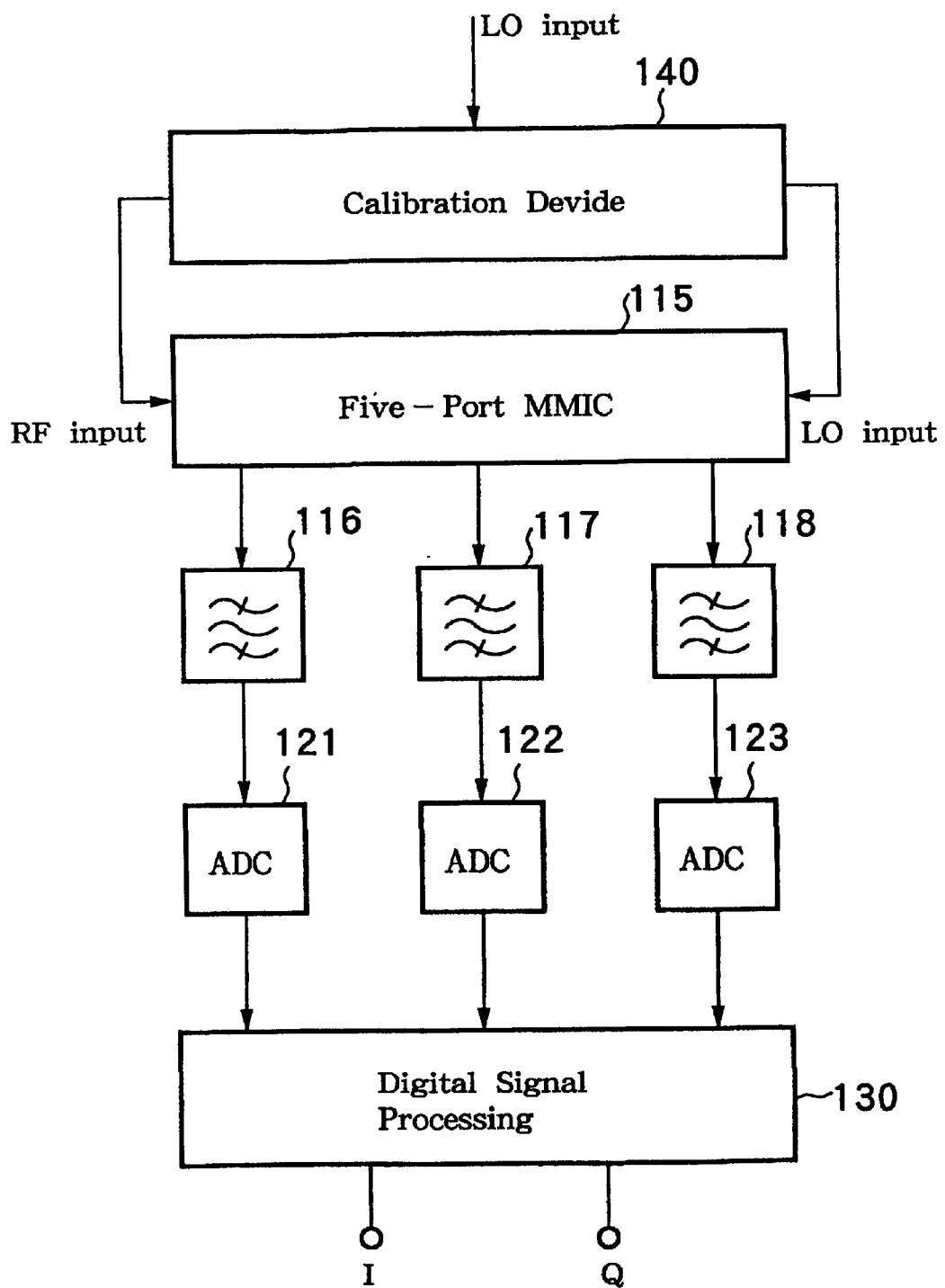
FIG. 9 is a view of the calibration procedure and device according to the present embodiment.

FIG. 9 is a view of the calibration procedure and device according to the present embodiment. With four known signals, I(1), Q(1), I(2), Q(2), I(3), Q(3), and I(4). Q(4), created by the calibration device, the following equations are derived:

$$I(1) = h_{I0} + h_{I1}P_1(1) + h_{I2}P_2(1) + h_{I3}P_3(1) \quad (5)$$

$$Q(1) = h_{I0} + h_{Q1}P_1(1) + h_{Q2}P_2(1) + h_{Q3}P_3(1) \quad (6)$$

$$I(2) = h_{I0} + h_{I1}P_1(2) + h_{I2}P_2(2) + h_{I3}P_3(2) \quad (7)$$

$$Q(2) = h_{Q0} + h_{Q1}P_1(2) + h_{Q2}P_2(2) + h_{Q3}P_3(2) \quad (8)$$

$$I(3) = h_{I0} + h_{I1}P_1(3) + h_{I2}P_2(3) + h_{I3}P_3(3) \quad (9)$$

$$Q(3) = h_{Q0} + h_{Q1}P_1(3) + h_{Q2}P_2(3) + h_{Q3}P_3(3) \quad (10)$$

$$I(4) = h_{I0} + h_{I1}P_1(4) + h_{I2}P_2(4) + h_{I3}P_3(4) \quad (11)$$

$$Q(4) = h_{Q0} + h_{Q1}P_1(4) + h_{Q2}P_2(4) + h_{Q3}P_3(4) \quad (12)$$

From these equations, the coefficients $h_{hi}$ and $h_{Q1}$ can be determined. The calibration device 140 can be comprised of four switches, one attenuator, and two phase shifters.

As explained above, according to the present embodiment, the universal platform for the SDR employs the direct conversion approach with the five-port MMIC 115 followed by reconfigurable reprogrammable devices such as DSP's or FPGA's. The present universal platform is based on the linear operation of the devices. Thus, the DC offset problem may be solved. It is also possible to support very wide bandwidths compared with conventional I/Q receivers. Therefore, the present universal platform is suitable for multimode and multiband communications.

Especially, the five-port MMIC serving as the receiver is based on the linear operation of the device, and related non-linear effects may be omitted. The power level of the local oscillator (LO) is much smaller compared to the classical approach. Therefore, the DC offset problem may be overcome. The other advantage is that the phase shifter in the multi-port may take any values, theoretically between 0 and 90 degrees, excluding boundary values. This is an important issue considering the fact that the conventional I/Q demodulator requires a 90 degree phase shifter and phase shifters are usually linear, frequency dependent devices. Thus, the present DC receiver is able to support a wider bandwith compared with conventional I/Q receivers.

Note that in the present embodiment, the n-port MMIC was explained based on an example of a five-port MMIC, however, the present invention is not limited to this. Needless to say the present invention can be applied to other types of MMIC such as a three-port MMIC, a four-port MMIC, and a six-port MMIC (for example, refer to WO 99/33166 (PCT/EP98/08329)).

Below, the configuration of the three-port MMIC, the four-port MMIC, and the six-port MMIC will be explained with reference to FIGS. 10, 11, and 12.

Figure 10:
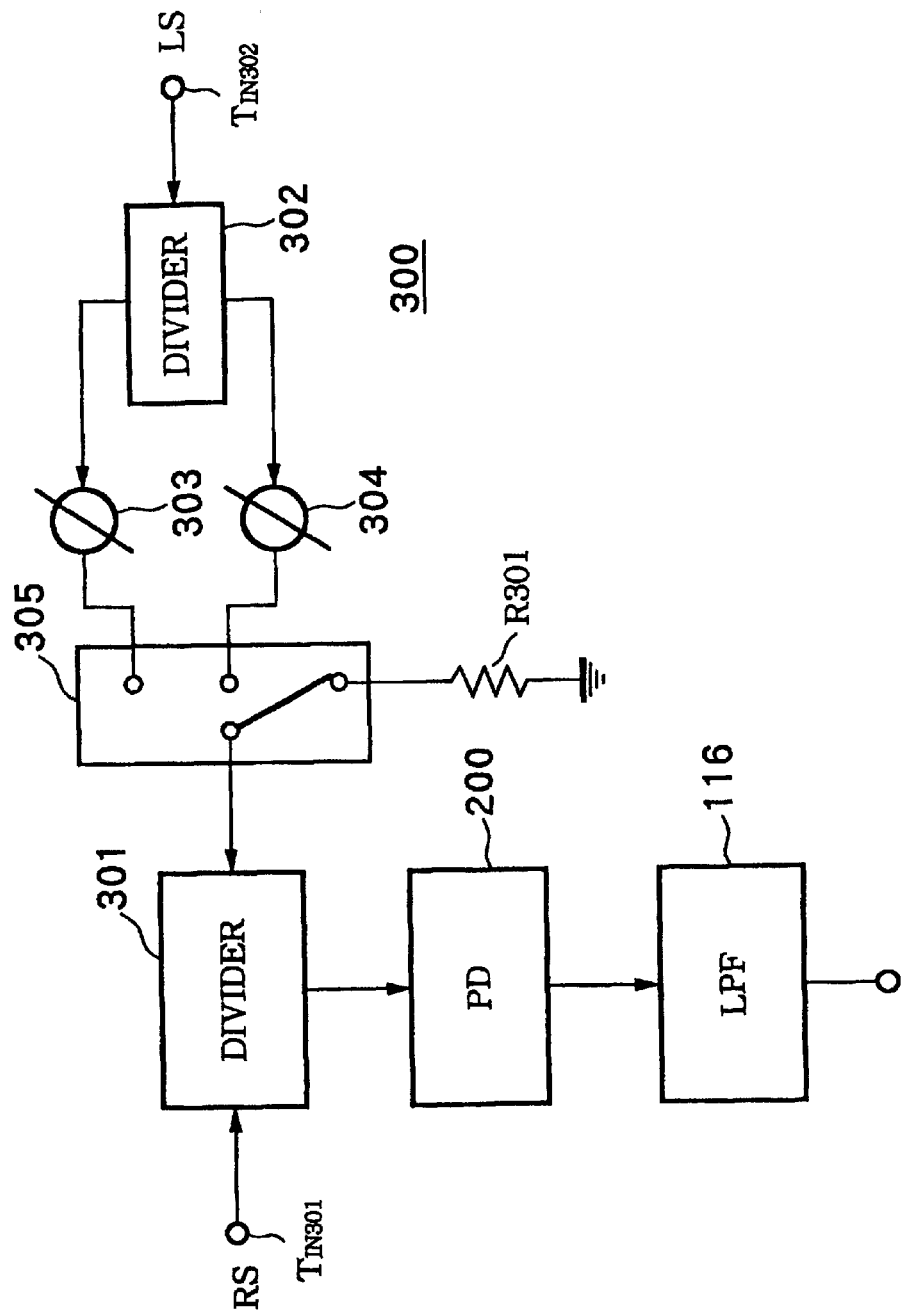
FIG. 10 is a view of an example of the configuration of a three-port MMIC according to the present invention.

FIG. 10 is a view of an example of the configuration of the three-port MMIC according to the present invention.

The three-port MMIC 300 comprises, as shown in FIG. 10, one power detector 200 having, for example, the same structure as FIG. 6, a received signal RS use input terminal $T_{IN301}$, a local signal LS use input terminal $T_{IN302}$, dividers 301 and 302, phase shifters 303 and 304, and a switching circuit 305.

In this case, only one LPF 116 is arranged at a later stage of the three-port MMIC 300.

Here, the three ports are comprised of the received signal RS use input terminal $T_{IN301}$, the local signal LS use input terminal $T_{IN302}$, and an output port of the divider 301 to the power detector 200.

In the three-port MMIC 300, the received signal RS input to the input terminal $T_{IN301}$ is input to the divider 301. In the divider 301, the input signal is divided to two signals, and one divided signal is supplied to the power detector 200.

Alternatively, the local signal input to the input terminal $T_{IN301}$ is input to the divider 302. In the divider 302, the input signal is divided to two signals. One divided signal is input to the phase shifter 303, shifted in phase by θ, and then supplied to the switching circuit 305. The other divided signal is input to the phase shifter 304, shifted in phase by θ, and then supplied to the switching circuit 305. The signals shifted in phases by the phase shifters 303 and 304 are selectively supplied to the divider 301 by the switching circuit 305.

The input signal to the divider 301 is divided to two signals, and one divided signal is supplied to the power detector 200.

In the power detector 200, the amplitude component of the supplied signal is detected and the detected amplitude component is supplied to the LPF 116.

In the case of using the three-port MMIC 300, the same effects as in the case of the five-port MMIC can be obtained.

Figure 11:
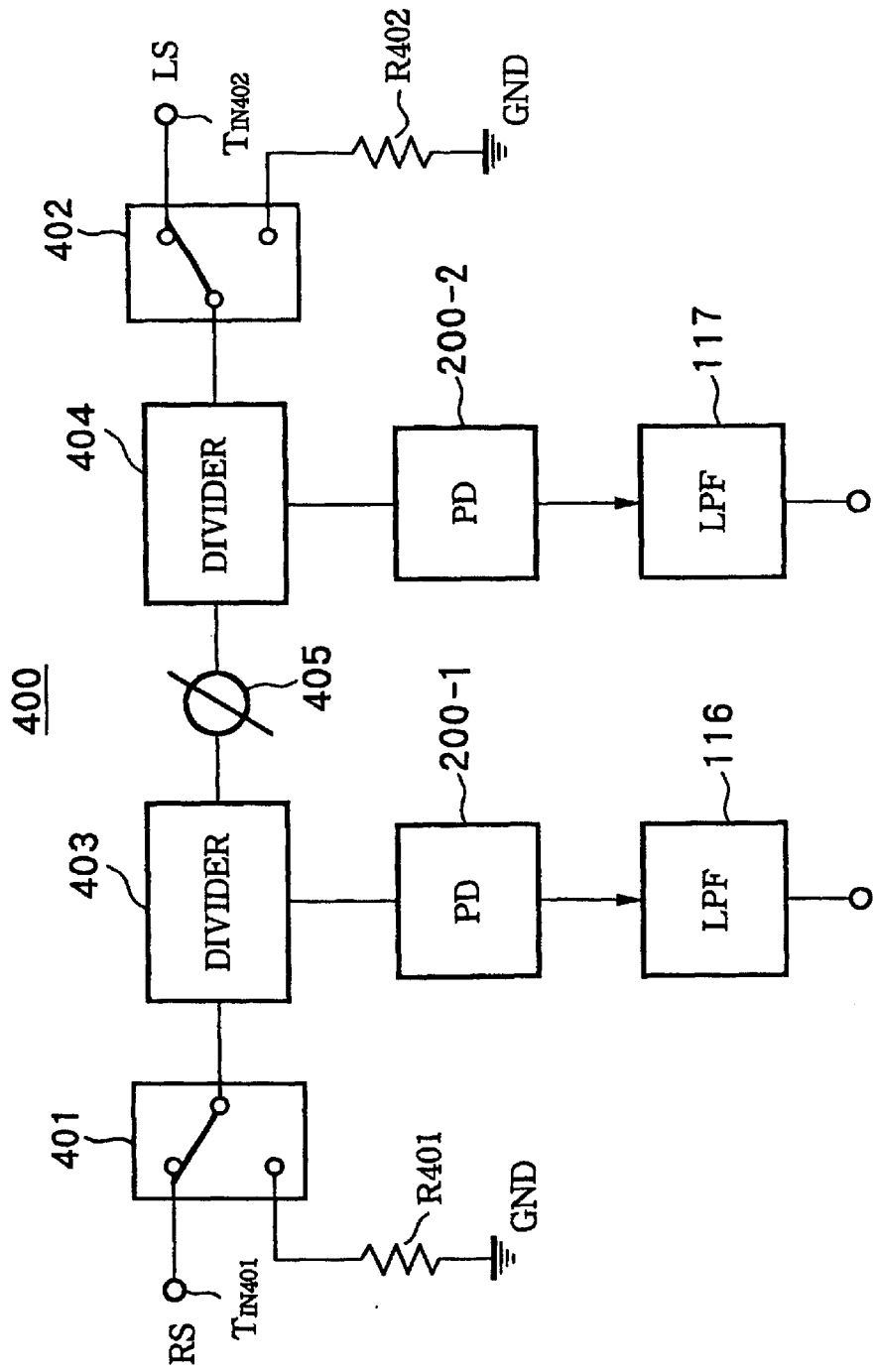
FIG. 11 is a view of an example of the configuration of a four-port MMIC according to the present invention.

FIG. 11 is a view of an example of the configuration of the four-port MMIC according to the present invention.

The four-port MMIC 400 comprises, as shown in FIG. 11, two power detectors 200-1, 200-2 having, for example, the same structures as FIG. 6, a received signal RS use input terminal $T_{IN401}$, a local signal LS use input terminal $T_{IN402}$, switching circuits 401 and 402, dividers 403 and 404, and a phase shifter 405.

In this case, two LPF's 116 and 117 are arranged at a later stage of the four-port MMIC 400.

Here, the four ports are comprised of the received signal RS use input terminal $T_{IN401}$, the local signal LS use input terminal $T_{IN402}$, an output port of the divider 403 to the power detector 200-1, and an output port of the divider 404 to the power detector 200-2.

In the four-port MMIC 400, the received signal RS input to the input terminal $T_{IN401}$ is input to the divider 403 through the high-speed switching circuit 401. In the divider 403, the input signal is divided to two signals. One divided signal is supplied to the power detector 200-1, while the other divided signal is input to the phase shifter 405.

In the phase shifter 405, the received signal from the divider 403 is shifted in phase by e. The signal shifted in phase is input to the divider 404, where the input signal is divided to two signals. One divided signal is input to the power detector 200-2, while the other divided signal is supplied to the switching circuit 402. Alternatively, the local signal input to the input terminal $T_{IN102}$ is input to the divider 404 through the high-speed switching circuit 402, and then the local signal is divided to two signals by the divider 404. One divided signal is input to the power detector 200-2, while the other divided signal is input to the phase shifter 405.

In the phase shifter 405, the local signal from the divider 404 is shifted in phase by e. The signal shifted in phase is input to the divider 403, where the input signal is divided to two signals. One divided signal is input to the power detector 200-1, while the other divided signal is input to the high-speed switching circuit 401.

In the power detector 200-1, the amplitude component of the supplied signal is detected, and the detected amplitude component is supplied to the LPF 116.

In the power detector 200-2, the amplitude component of the supplied signals is detected, and the detected amplitude component is supplied to the LPF 117.

In the case of using the four-port MMIC 400, the same effects as in the case of the five-port MMIC can be obtained.

Figure 12:
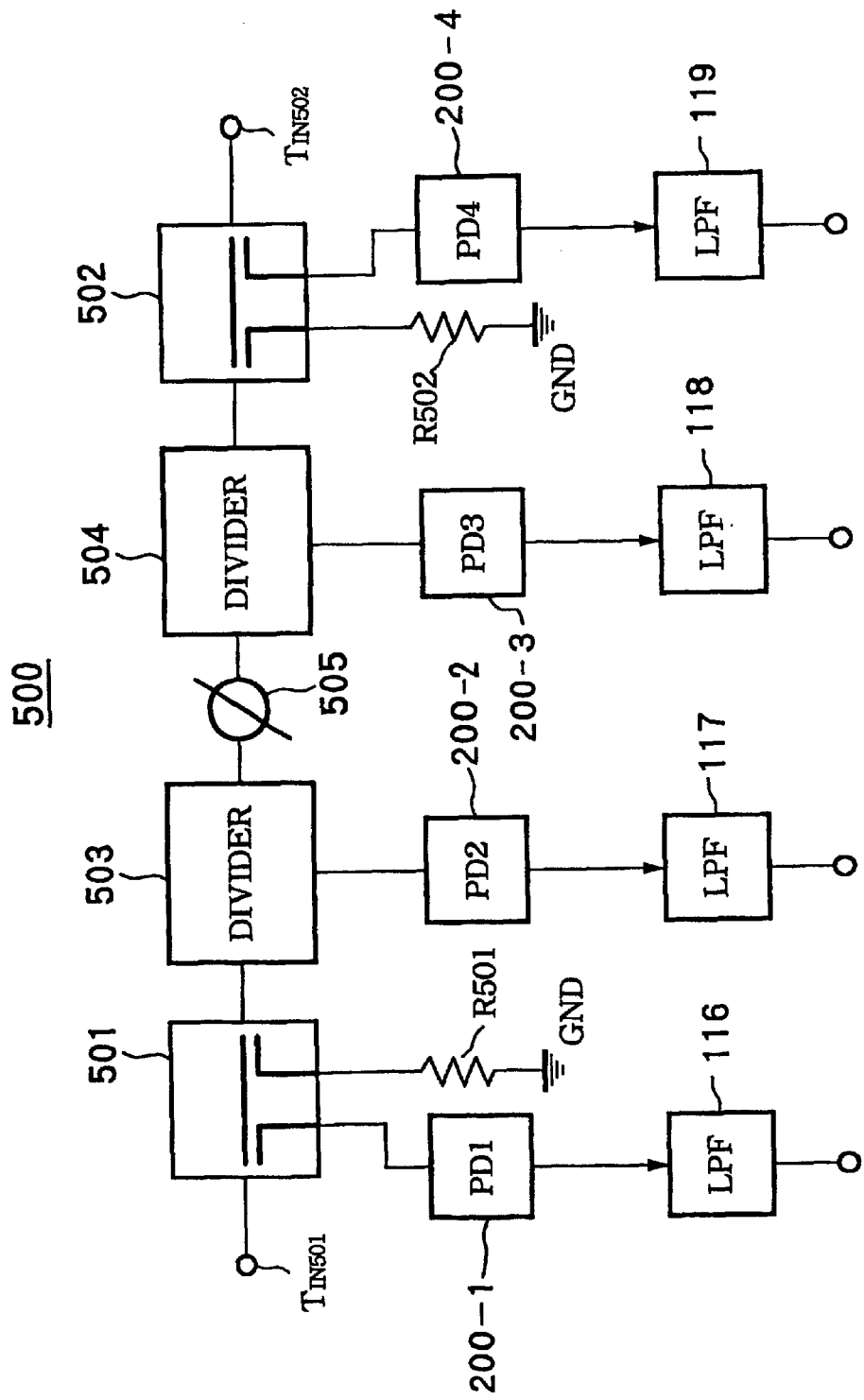
FIG. 12 is a view of an example of the configuration of a six-port MMIC according to the present invention.

FIG. 12 is a view of an example of the configuration of the six-port MMIC according to the present invention.

The six-port MMIC 500 comprises, as shown in FIG. 12, four power detectors 200-1, 200-2, 200-3, and 200-4 having, for example, the same structures as FIG. 6, a received signal RS use input terminal $T_{IN501}$, a local signal LS use input terminal $T_{IN502}$, directional couplers 501 and 502, dividers 503 and 504, and a phase shifter 505.

In this case, four LPF's 116, 117, 118, and 119 are arranged at a later stage of the six-port MMIC 500.

Here, the six ports are comprised of the received signal RS use input terminal $T_{IN501}$, the local signal LS use input terminal $T_{IN502}$, and output port of the directional coupler 501 to the power detector 200-1, an output port of the divider 503 to the power detector 200-2, an output port of the divider 504 to the power detector 200-3, and an output port of the directional coupler 502 to the power detector 200-4.

In the six-port MMIC 500, the received signal RS input to the input terminal $T_{IN501}$ is input to the power detector 200-1 and the divider 503 through the directional circuit 501. In the divider 503, the input signal is divided to two signals. One divided signal is supplied to the power detector 200-2, while the other divided signal is input to the phase shifter 505.

In the phase shifter 505, the received signal from the divider 503 is shifted in phase by θ. The signal shifted in phase is input to the divider 504, where the input signal is divided to two signals. One divided signal is input to two power detector 200-3, while the other divided signal is supplied to the directional coupler 502.

Alternatively, the local signal input to the input terminal $T_{IN502}$ is input to the power detector 200-4 and the divider 504 through the directional coupler 502, and then the local signal is divided to two signals by the divider 504. One divided signal is input to the power detector 200-2, while the other divided signal is input to the phase shifter 505.

In the phase shifter 505, the local signal from the divider 504 is shifted in phase by θ. The signal shifted in phase is input to the divider 503, where the input signal is divided to two signals. One divided signal is input to the power detector 200-2, while the other divided signal is input to the directional coupler 501.

As explained above, the power detector 200-1 receives the received signal RS. In the power detector 200-1, the amplitude component of the supplied signal is detected, and the detected amplitude component is supplied to the LPF 116.

The power detector 200-2 receives the received signal and the local signal shifted in phase by θ. In the power detector 200-2, amplitude components of the supplied signals are detected, and the detected amplitude components are supplied to the LPF 117.

The power detector 200-3 receives the local signal and the received signal shifted in phase by e. In the power detector 200-3, amplitude components of the supplied signals are detected, and the detected amplitude components are supplied to the LPF 118.

The power detector 200-4 receives the local signal LS. In the power detector 200-4, an amplitude component of the supplied signal is detected, and the detected amplitude component is supplied to the LPF 119.

In the case of using the six-port MMIC 500, the same effects as in the case of the five-port MMIC can be obtained.

Further, in the present embodiment, the power detector was explained based on the example of FIG. 6, however, the present invention is not limited to this. Needless to say the present invention can be applied to other types of power detectors. Below, a few other configurations of the power detector will be explained with reference to FIGS. 13, 14, and 15.

Figure 13:
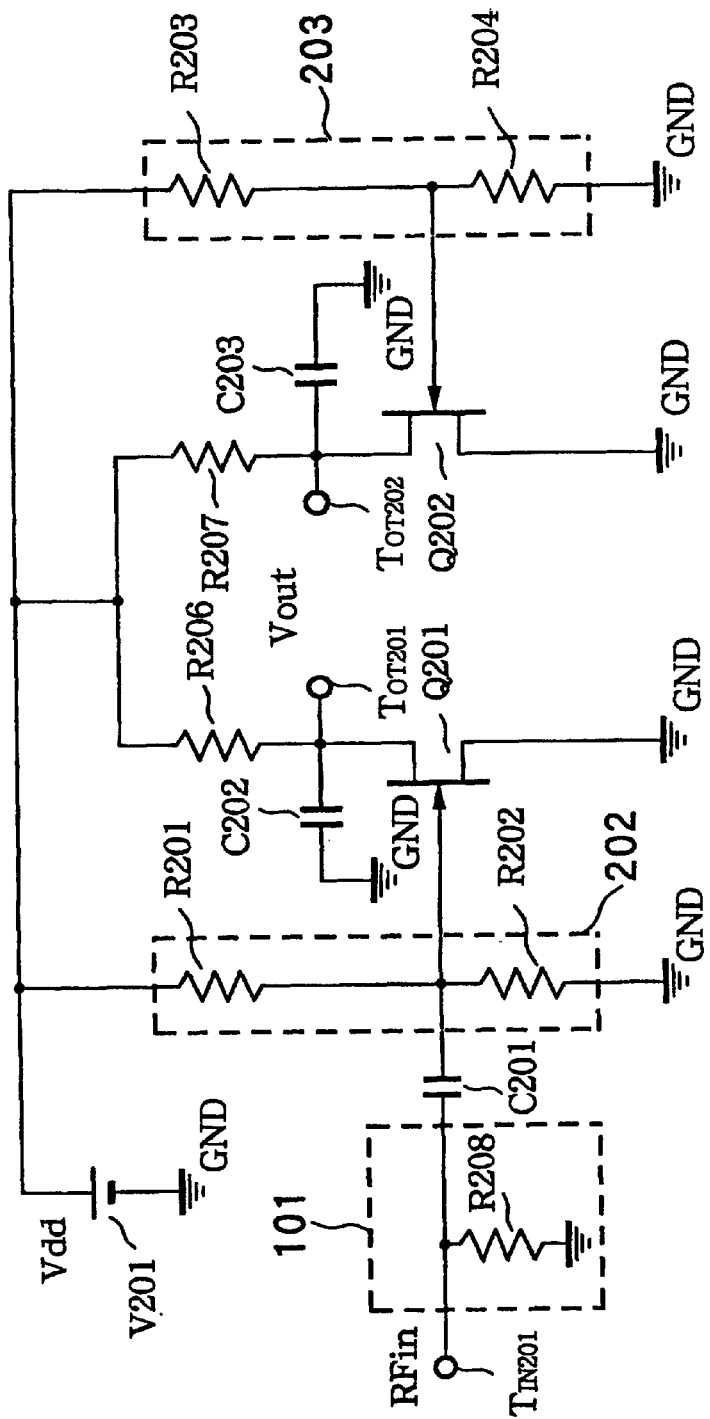
FIG. 13 is a view of another example of the configuration of the power detector according to the present invention.

FIG. 13 is a view of another example of the configuration of the power detector according to the present invention.

The point of difference of the power detector 200A of FIG. 13 from the power detector 200 of FIG. 6 is that the sources of the transistors Q201 and Q202 are directly connected to the ground potential GND in place of connecting through the resistor.

The rest of the configuration is the same as that in FIG. 6.

According to this power defector 200A, in addition to the same effects as in the above power detector 200 of FIG. 6, a lower power consumption can be realized.

Figure 14:
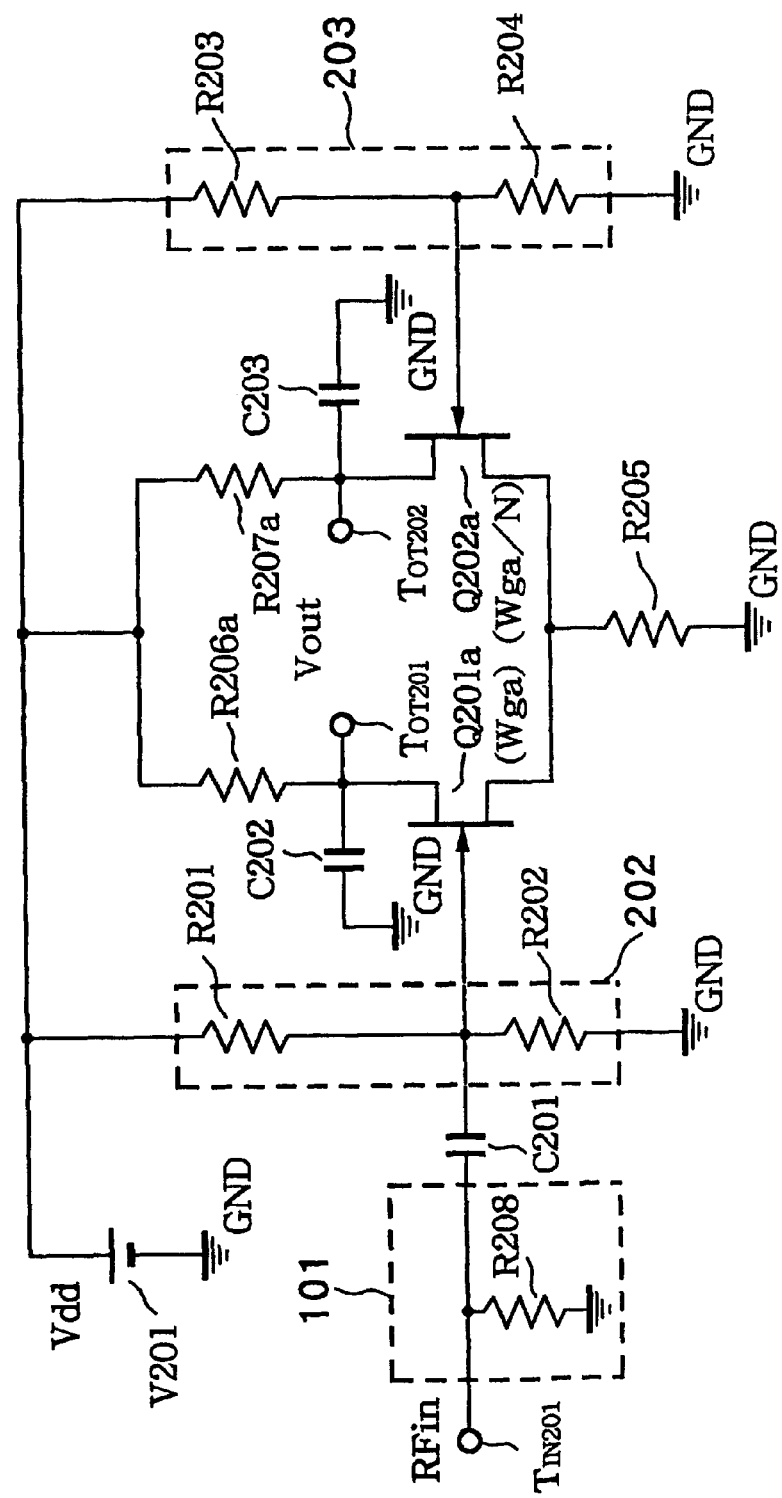
FIG. 14 is a view of another example of the configuration of the power detector according to the present invention.

FIG. 14 is a view of another example of the configuration of the power detector according to the present invention.

The point of difference of the power detector 200B of FIG. 14 from the poser detector 200 of FIG. 6 is that a gate width of $W_{gb}$ of the transistor Q202 is set smaller than a gate width $W_{gn}$ of the transistor Q201, and a resistance Rdb of the drain bias use resistor R207a Is larger than a resistance Rda of the drain bias use resistor R206a.

Concretely, the ratio $W_{gn}/W_{gb}$ is set to N, and the resistance Rdb of the resistor R207a Is set to N times the resistance Rda of the resistor R206a.

According to the power detector 200B of FIG. 14, in addition to the same effects as in the above power detector 200 of FIG. 6, it is possible to reduce the current consumption to (N+1)/(2N) times.

Figure 15:
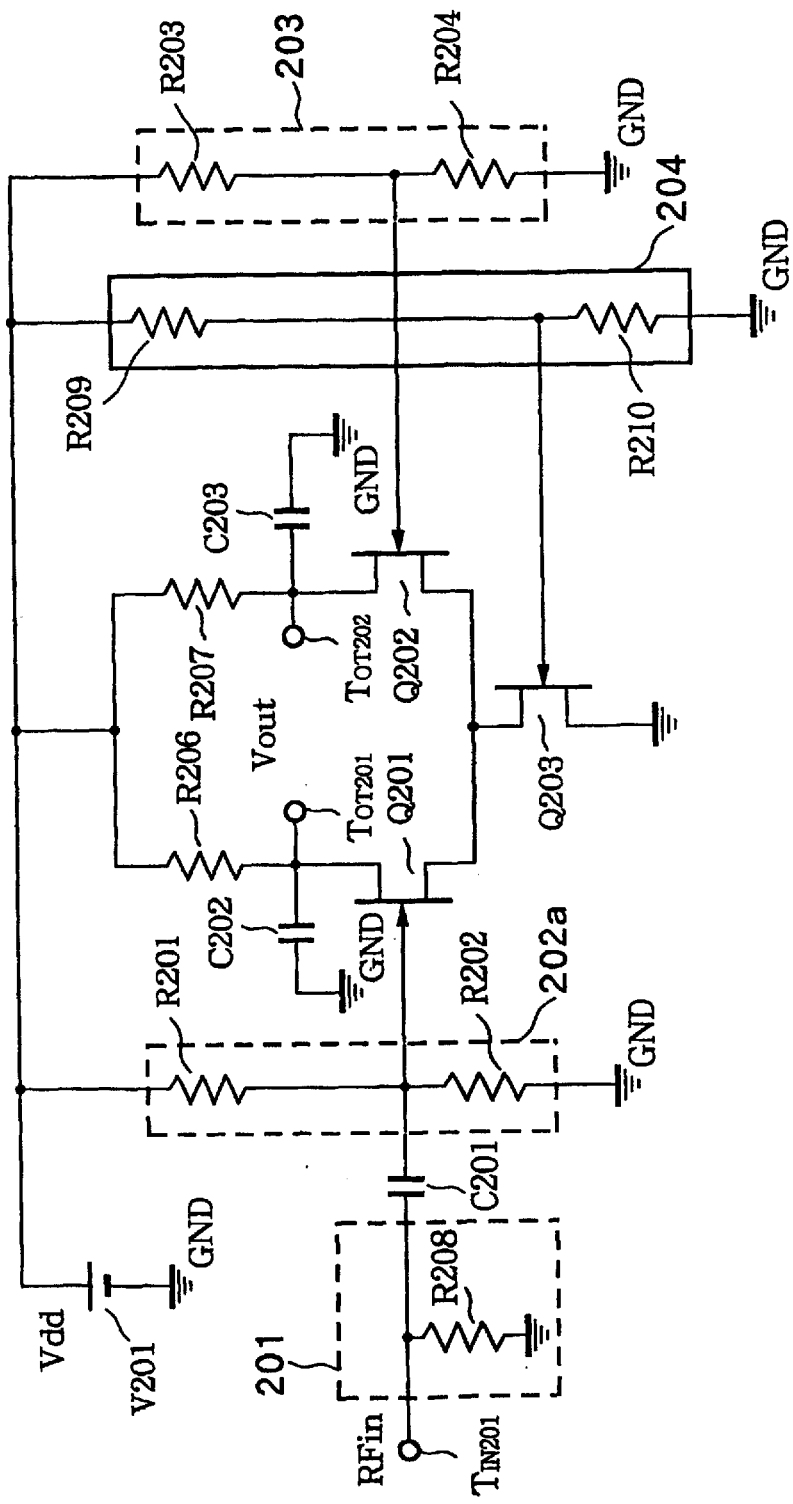
FIG. 15 is a view of another example of the configuration of the power detector according to the present invention.

FIG. 15 is a view of another example of the configuration of the power detector according to the present invention.

The point of difference of the power detector 200C of FIG. 15 from the power detector 200 of FIG. 6 is that the connection point of sources of the transistors Q201 and Q202 is connected to the ground potential GND by a field effect transistor Q203 serving as a current source in which a gate is supplied with a bias voltage from a gate bias supplying circuit 204 constituted by resistors R209 and R210 connected in series between the power source V201 and the ground potential GND.

According to the power detector 200C of the FIG. 15, the same effects as in the above power detector 200 of FIG. 6 can be obtained.

INDUSTRIAL APPLICABILITY

As described above, according to the universal platform for the SDR of the present invention, the universal platform employs the direct conversion approach with the n-port MMIC 115 followed by reconfigurable reprogrammable devices such as DSP's or FPGA's. The universal platform is based on the linear operation of the devices. Thus, the DC offset problem may be solved. It is also possible to support very wide bandwidths compared with conventional I/Q receivers. Therefore, the present universal platform is suitable for multimode and multiband communications.

What is claimed is:

1. A universal platform for software defined radio, comprising:
    an n (n being an integer of 3 or more)-port receiver including
        a first input terminal receiving a received signal,
        a second input terminal receiving a local signal,
        a plurality of power detectors for receiving a plurality of input power signals and generating a plurality of power-detected output signals,
        a directional coupler coupled to the first input terminal and a first power detector of said plurality of power detectors, said directional coupler operating to directionally couple said received signal to said first power detector, said directional coupler generating a first output signal
        at least first and second dividers said first divider coupled to said directional coupler and a second power detector of said plurality of power detectors and operating to divide the first output signal said first divider generating a second output signal, said second divider coupled to said second input terminal and a third power detector of said plurality of power detectors, and operating to divide the local signal, said second divider generating a third output signal, and
        a phase shifter coupled to said at least first and second dividers, said phase shifter operating to shift the phase of said second output signal or the phase of said third output signal; and
    a converter for converting the power-detected output signals of said plurality of power detectors to a plurality of signal components included in the received signal or the local signal.

2. A universal platform for software defined radio as set forth in claim 1, wherein the power detector comprises:
    a first field effect transistor receiving one of said plurality of input power signals at its gate,
    a second field effect transistor with a source connected to a source of the first field effect transistor,
    a first gate bias supplying circuit for supplying a gate bias voltage to the gate of the first field effect transistor,
    a second gate bias supplying circuit for supplying a gate bias voltage to a gate of the second field effect transistor,
    a current source connected to the sources of the first field effect transistor and the second field effect transistor,
    a drain bias supplying circuit for supplying a drain bias voltage to the drains of the first field effect transistor and the second field effect transistor,
    a first capacitor connected between the drain of the first field effect transistor and a reference potential, and
    a second capacitor connected between the drain of the second field effect transistor and the reference potential, and
    the voltage difference between a first drain voltage at the drain of the first field effect transistor and a second drain voltage at the drain of the second field effect transistor is processed as a detection output.

3. A universal platform for software defined radio as set forth in claim 2, wherein
    the first field effect transistor and the second field effect transistor have substantially equivalent characteristics,
    the drain bias supplying circuit includes a first drain bias use resistance element connected between the drain of the first field effect transistor and a voltage source and a second drain bias use resistance element connected between the drain of the second field effect transistor and a voltage source,
    a resistance of the first drain bias use resistance element and a resistance of the second drain bias use resistance element are set to substantially equivalent values, and
    a capacitance of the first capacitor and a capacitance of the second capacitor are set to substantially equivalent values.

4. A universal platform for software defined radio as set forth in claim 2, wherein
    when a gate width of the first field effect transistor is $W_{ga}$ and a gate width of the second field effect transistor is $W_{gb}$, the ratio $W_{ga}/W_{gb}$ is set to N,
    the drain bias supplying circuit includes a first drain bias use resistance element connected between the drain of the first field effect transistor and a voltage source and a second drain bias use resistance element connected between the drain of the second field effect transistor and a voltage source,
    a resistance Ra of the first drain bias use resistance element and a resistance of the second drain bias use resistance Rb element are set so as to satisfy the condition Ra/Rb=1/N, and
    a capacitance of the first capacitor and a capacitance of the second capacitor are set to substantially equivalent values.

5. A universal platform for software defined radio as set forth in claim 1, wherein the power detector comprises;
    a first field effect transistor receiving the input signal at its gate and with a source connected to a reference potential;

a second field effect transistor with a source connected to the reference potential;

a first gate bias supplying circuit for supplying a gate bias voltage to the gate of the first field effect transistor;

a second gate bias supplying circuit for supplying a gate bias voltage to a gate of the second field effect transistor;

a drain bias supplying circuit for supplying a drain bias voltage to the drains of the first field effect transistor and the second field effect transistor;

a first capacitor connected between the drain of the first field effect transistor and a reference potential; and a second capacitor connected between the drain of the second field effect transistor and the reference potential, wherein the voltage difference between a first drain voltage at the drain of the first field effect transistor and a second drain voltage at the drain of the second field effect transistor is processed as a detection output.

6. A universal platform for software defined radio as set forth in claim 2, wherein the first field effect transistor and the second field effect transistor have substantially equivalent characteristics.

7. A universal platform for software defined radio as set forth in claim 2, wherein the drain bias supplying circuit includes a first drain bias use resistance element connected between the drain of the first field effect transistor and a voltage source and a second drain bias use resistance element connected between the drain of the second field effect transistor and a voltage source.

8. A universal platform for software defined radio as set forth in claim 2, wherein a resistance of the first drain bias use resistance element and a resistance of the second drain bias use resistance element are set to substantially equivalent values.

9. A universal platform for software defined radio as set forth in claim 2, wherein a capacitance of the first capacitor and a capacitance of the second capacitor are set to substantially equivalent values.

10. A universal platform for software defined radio as set forth in claim 2, wherein when a gate width of the first field effect transistor is $W_{ga}$ and a gate width of the second field effect transistor is $W_{gb}$, the ratio $W_{ga}/W_{gb}$ is set to N.

11. A universal platform for software defined radio as set forth in claim 2, wherein the drain bias supplying circuit includes a first drain bias use resistance element connected between the drain of the first field effect transistor and a voltage source and a second drain bias use resistance element connected between the drain of the second field effect transistor and a voltage source.

12. A universal platform for software defined radio as set forth in claim 2, wherein a resistance Ra of the first drain bias use resistance element and a resistance of the second drain bias use resistance Rb element are set so as to satisfy the condition Ra/Rb=1/N.

13. A universal platform for software defined radio as set forth in claim 2, wherein a capacitance of the first capacitor and a capacitance of the second capacitor are set to substantially equivalent values.

14. A universal platform for software defined radio, comprising:

an n (n being an integer of 3 or more)-port receiver including:
   a first input terminal receiving a received signal,
   a second input terminal receiving a local signal,
   a plurality of power detectors for receiving a plurality of input power signals and generating a plurality of analog power-detected output signals a directional coupler coupled to the first input terminal and a first power detector of said plurality of power detectors said directional coupler operating to directionally couple said received signal to said first power detector, said directional coupler generating a first output signal, at least first and second dividers, said first divider coupled to said directional coupler and a second power detector of said plurality of power detectors, and operating to divide the first output signal, said first divider generating a second output signal, said second divider coupled to said second input terminal and a third power detector of said plurality of power detectors, and operating to divide the local signal, said second divider generating a third output signal, and a phase shifter coupled to said at least first and second dividers, said phase shifter operating to shift the phase of said second output signal or the phase of said third output signal;

at least one analog-to-digital (A/D) converter for converting the output analog power-detected output signal from a corresponding power detector to a digital signal; and a digital signal processing part for converting the power-detected output signal of the power detector through the A/D converter to a plurality of signal components included in the received signal or the local signal.

15. A universal platform for software defined radio as set forth in claim 14, wherein the digital signal processing part compensates for the non-linearity of the power detector.

16. A universal platform for software defined radio as set forth in claim 14, wherein:

the power detector comprises:
   a first field effect transistor receiving one of said plurality of input power signals at its gate,
   a second field effect transistor with a source connected to a source of the first field effect transistor,
   a first gate bias supplying circuit for supplying a gate bias voltage to the gate of the first field effect transistor,
   a second gate bias supplying circuit for supplying a gate bias voltage to a gate of the second field effect transistor,
   a current source connected to the sources of the first field effect transistor and the second field effect transistor,
   a drain bias supplying circuit for supplying a drain bias voltage to the drains of the first field effect transistor and the second field effect transistor,
   a first capacitor connected between the drain of the first field effect transistor and a reference potential, and
   a second capacitor connected between the drain of the second field effect transistor and the reference potential, and
the voltage difference between a first drain voltage at the drain of the first field effect transistor and a second drain voltage at the drain of the second field effect transistor is processed as a detection output.

17. A universal platform for software defined radio as set forth in claim 16, wherein:
the first field effect transistor and the second field effect transistor have substantially equivalent characteristics,
the drain bias supplying circuit includes a first drain bias use resistance element connected between the drain of the first field effect transistor and a voltage source and a second drain bias use resistance element connected between the drain of the second field effect transistor and a voltage source, a resistance of the first drain bias use resistance element and a resistance of the second drain bias use resistance element are set to substantially equivalent values, and a capacitance of the first capacitor and a capacitance of the second capacitor are set to substantially equivalent values.

18. A universal platform for software defined radio as set forth in claim 16, wherein:

when a gate width of the first field effect transistor is $W_{ga}$ and a gate width of the second field effect transistor is $W_{gb}$, the ratio $W_{ga}/W_{gb}$ is set to N, the drain bias supplying circuit includes a first drain bias use resistance element connected between the drain of the first field effect transistor and a voltage source and a second drain bias use resistance element connected between the drain of the second field effect transistor and a voltage source, a resistance Ra of the first drain bias use resistance element and a resistance of the second drain bias use resistance Rb element are set so as to satisfy the condition Ra/Rb=1/N, and a capacitance of the first capacitor and a capacitance of the second capacitor are set to substantially equivalent values.

19. A universal platform for software defined radio as set forth in claim 16, wherein the first field effect transistor and the second field effect transistor have substantially equivalent characteristics.

20. A universal platform for software defined radio as set forth in claim 16, wherein the drain bias supplying circuit includes a first drain bias use resistance element connected between the drain of the first field effect transistor and a voltage source and a second drain bias use resistance element connected between the drain of the second field effect transistor and a voltage source.

21. A universal platform for software defined radio as set forth in claim 16, wherein a resistance of the first drain bias use resistance element and a resistance of the second drain bias use resistance element are set to substantially equivalent values.

22. A universal platform for software defined radio as set forth in claim 16, wherein a capacitance of the first capacitor and a capacitance of the second capacitor are set to substantially equivalent values.

23. A universal platform for software defined radio as set forth in claim 16, wherein when a gate width of the first field effect transistor is $W_{ga}$ and a gate width of the second field effect transistor is $W_{gb}$, the ratio $W_{ga}/W_{gb}$ is set to N.

24. A universal platform for software defined radio as set forth in claim 16, wherein the drain bias supplying circuit includes a first drain bias use resistance element connected between the drain of the first field effect transistor and a voltage source and a second drain bias use resistance element connected between the drain of the second field effect transistor and a voltage source.

25. A universal platform for software defined radio as set forth in claim 16, wherein a resistance Ra of the first drain bias use resistance element and a resistance of the second drain bias use resistance Rb element are set so as to satisfy the condition Ra/Rb=1/N.

26. A universal platform for software defined radio as set forth in claim 16, wherein a capacitance of the first capacitor and a capacitance of the second capacitor are set to substantially equivalent values.

27. A universal platform for software defined radio as set forth in claim 14, wherein the power detector comprises:

a first field effect transistor receiving the input signal at its gate and with a source connected to a reference potential;

a second field effect transistor with a source connected to the reference potential;

a first gate bias supplying circuit for supplying a gate bias voltage to the gate of the first field effect transistor;

a second gate bias supplying circuit for supplying a gate bias voltage to a gate of the second field effect transistor;

a drain bias supplying circuit for supplying a drain bias voltage to the drains of the first field effect transistor and the second field effect transistor;

a first capacitor connected between the drain of the first field effect transistor and a reference potential; and a second capacitor connected between the drain of the second field effect transistor and the reference potential, wherein the voltage difference between a first drain voltage at the drain of the first field effect transistor and a second drain voltage at the drain of the second field effect transistor is processed as a detection output.

\* \* \* \* \*